(12) United States Patent
Bhattacharya et al.

(10) Patent No.: US 8,809,237 B2
(45) Date of Patent: Aug. 19, 2014

(54) METHOD OF FORMING AN HTS ARTICLE

(75) Inventors: Raghu N. Bhattacharya, Littleton, CO (US); Xun Zhang, Schenectady, NY (US); Venkat Selvamanickam, Wynantskill, NY (US)

(73) Assignee: SuperPower, Inc., Schenectady, NY (US)

( * ) Notice: Subject to any disclaimer, the term of this patent is extended or adjusted under 35 U.S.C. 154(b) by 1298 days.

(21) Appl. No.: 12/033,660

(22) Filed: Feb. 19, 2008

(65) Prior Publication Data

US 2009/0209429 A1 Aug. 20, 2009

(51) Int. Cl.
*H01L 39/24* (2006.01)

(52) U.S. Cl.
USPC ............................................ 505/434; 427/62

(58) Field of Classification Search
USPC ............................. 505/236, 237, 434; 427/62
See application file for complete search history.

(56) References Cited

U.S. PATENT DOCUMENTS

| | | | | |
|---|---|---|---|---|
| 3,954,572 A * | 5/1976 | Ziegler et al. | ..................... | 205/51 |
| 4,914,081 A * | 4/1990 | Miller et al. | ................... | 505/211 |
| 5,073,240 A * | 12/1991 | Raggio et al. | ................. | 204/491 |
| 5,470,820 A | 11/1995 | Hauser et al. | | |
| 5,971,847 A * | 10/1999 | Webb | ............................ | 454/290 |
| 5,972,847 A | 10/1999 | Feenstra et al. | | |
| 7,324,259 B2 | 1/2008 | Kokeguchi et al. | | |
| 2002/0090497 A1 * | 7/2002 | Kataoka et al. | ................ | 428/209 |
| 2004/0266628 A1 | 12/2004 | Lee et al. | | |
| 2005/0016759 A1 | 1/2005 | Malozemoff et al. | | |
| 2009/0088326 A1 * | 4/2009 | Baecker | .......................... | 505/434 |
| 2009/0137399 A1 * | 5/2009 | Ueyama et al. | ................ | 505/230 |

FOREIGN PATENT DOCUMENTS

| | | | | |
|---|---|---|---|---|
| CN | 1813317 A | | 8/2006 | |
| WO | WO 2007/032207 | * | 3/2007 | ............. H01B 12/06 |
| WO | WO 2008/000485 | * | 1/2008 | ............. H01L 39/24 |

OTHER PUBLICATIONS

Rosamilia et al. "Additive enhanced nonaqueous electrodeposition of silver on Ba2YCu3O7". J. Mater. Res., vol. 5, No. 8, pp. 1612-1615, Aug. 1990.*
Supplementary European Search Report dated Apr. 18, 2013 from SP316-EP, 5 pgs.

* cited by examiner

*Primary Examiner* — Paul Wartalowicz
(74) *Attorney, Agent, or Firm* — Thomas P. Weber; Abel Law Group, LLP

(57) ABSTRACT

A method of forming a superconducting article includes providing a substrate tape, forming a superconducting layer overlying the substrate tape, and depositing a capping layer overlying the superconducting layer. The capping layer includes a noble metal and has a thickness not greater than about 1.0 micron. The method further includes electrodepositing a stabilizer layer overlying the capping layer using a solution that is non-reactive to the superconducting layer. The superconducting layer has an as-formed critical current $I_{C(AF)}$ and a post-stabilized critical current $I_{C(PS)}$. The $I_{C(PS)}$ is at least about 95% of the $I_{C(AF)}$.

5 Claims, 1 Drawing Sheet

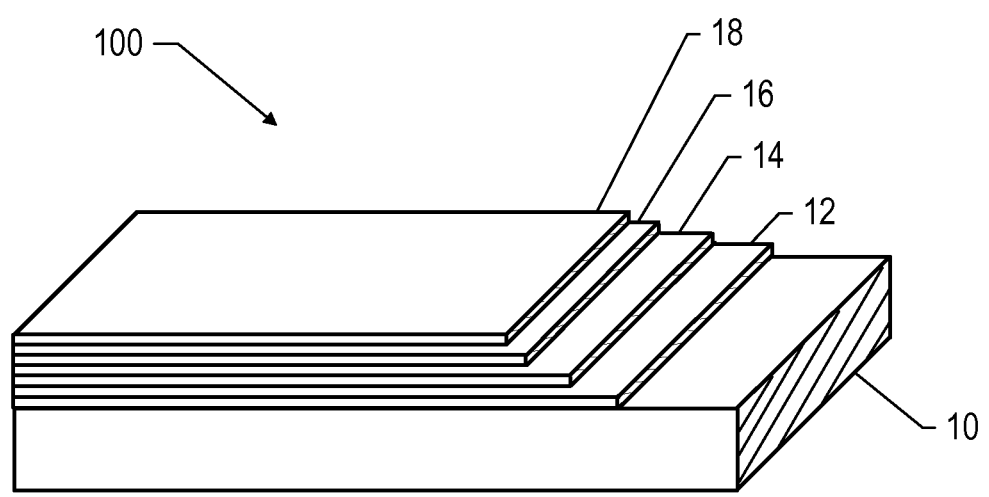

METHOD OF FORMING AN HTS ARTICLE

STATEMENT REGARDING FEDERALLY SPONSORED RESEARCH OR DEVELOPMENT

This invention was made under Cooperative Research and Development Agreement No. CRD-04-150 between SuperPower, Inc. and the National Renewable Energy Laboratory operated by Midwest Research Institute for the U.S. Department of Energy under U.S. Department of Energy Contract No. DE-AC36-99GO10337. The government has certain rights in the invention.

CROSS-REFERENCE TO RELATED APPLICATION(S)

Background

Superconductor materials have long been known and understood by the technical community. Low-temperature superconductors (low-$T_c$ or LTS) exhibiting superconducting properties at temperatures requiring use of liquid helium (4.2 K), have been known since 1911. However, it was not until somewhat recently that oxide-based high-temperature (high-$T_c$) superconductors have been discovered. Around 1986, a first high-temperature superconductor (HTS), having superconducting properties at a temperature above that of liquid nitrogen (77 K) was discovered, namely $YBa_2Cu_3O_{7-x}$ (YBCO), followed by development of additional materials over the past 15 years including $Bi_2Sr_2Ca_2Cu_3O_{10+y}$ (BSCCO), and others. The development of high-$T_c$ superconductors has created the potential of economically feasible development of superconductor components and other devices incorporating such materials, due partly to the cost of operating such superconductors with liquid nitrogen rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the inherent resistance of copper-based commercial power components is responsible for billions of dollars per year in losses of electricity, and accordingly, the power industry stands to gain based upon utilization of high-temperature superconductors in power components such as transmission and distribution power cables, generators, transformers, and fault current interrupters/limiters. In addition, other benefits of high-temperature superconductors in the power industry include a factor of 3-10 increase of power-handling capacity, significant reduction in the size (i.e., footprint) and weight of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the challenges associated with the commercialization of high-temperature superconductors, many exist around the fabrication of a superconducting tape segment that can be utilized for formation of various power components. A first generation of superconducting tape segment includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of a kilometer), due to materials and manufacturing costs, such tapes do not represent a widespread commercially feasible product.

Accordingly, a great deal of interest has been generated in the so-called second-generation HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an optional capping layer overlying the superconductor layer, and/or an optional electrical stabilizer layer overlying the capping layer or around the entire structure. However, to date, numerous engineering and manufacturing challenges remain prior to full commercialization of such second generation-tapes and devices incorporating such tapes. One particular challenge is to reduce the thickness or eliminating the capping layer overlying the superconductor layer.

SUMMARY

In an exemplary embodiment, a method of forming a superconducting article includes providing a substrate tape and forming a superconducting layer overlying the substrate. The superconducting layer has an as-formed critical current $I_{C(AF)}$. The method further includes depositing a capping layer overlying the superconducting layer and electrodepositing a stabilizer layer overlying the capping layer. The capping layer has a thickness not greater than about 1.0 micron and includes a noble metal. Electrodepositing is performed using a solution that is non-reactive to the superconducting layer. The superconducting layer has a post-stabilized critical current $I_{C(PS)}$. The $I_{C(PS)}$ is at least about 95% of the first $I_{C(AF)}$.

In another embodiment, a method of forming a superconducting article includes providing a substrate tape and forming a superconducting layer overlying the substrate. The superconducting layer has an as-formed critical current $I_{C(AF)}$. The method further includes electrodepositing a stabilizer layer overlying the superconducting layer. The superconducting layer has a post-stabilized critical current $I_{C(PS)}$. The $I_{C(PS)}$ is at least about 95% of the $I_{C(AF)}$.

In a further embodiment, a method of forming a superconducting article includes translating a substrate tape having a superconducting layer through a first electrodeposition system and a second electrodeposition system. The method further includes depositing a capping layer while translating through the first electrodeposition system. The capping layer includes a noble metal. The method further includes depositing a stabilizer layer while translating through the second electrodeposition system.

BRIEF DESCRIPTION OF THE DRAWINGS

The present disclosure may be better understood, and its numerous features and advantages made apparent to those skilled in the art by referencing the accompanying drawings.

FIG. 1 illustrates a prospective view showing the generalized structure of a superconducting article according to an embodiment.

The use of the same reference symbols in different drawings indicates similar or identical items.

DETAILED DESCRIPTION

In an embodiment, a method of forming a superconducting article may include providing a substrate tape, forming an HTS layer overlying the substrate, and electrodepositing a stabilizer layer overlying the superconducting layer. A critical current of the superconducting layer may be measured after forming to determine an as-formed critical current $I_{C(AF)}$. Additionally, a critical current of the superconducting layer may be measured after electrodepositing the stabilizer layer to determine a post-stabilized critical current $I_{C(PS)}$. The $I_{C(PS)}$ may be at least about 95% of the $I_{C(AF)}$.

Turning to FIG. 1, the generalized layered structure of a superconducting article 100 according to an embodiment of the present invention is depicted. The superconducting article includes a substrate 10, a buffer layer 12 overlying the substrate 10, a superconducting layer 14, followed by a capping layer 16, typically a noble metal, and a stabilizer layer 18, typically a non-noble metal such as copper. The buffer layer 12 may consist of several distinct films. The stabilizer layer 18 may extend around the periphery of the superconducting article 100, thereby encasing it.

The substrate 10 is generally metal-based, and typically, an alloy of at least two metallic elements. Particularly suitable substrate materials include stainless steel alloys and nickel-based metal alloys such as the known Hastelloy® or Inconel® group of alloys. These alloys tend to have desirable creep, chemical and mechanical properties, including coefficient of expansion, tensile strength, yield strength, and elongation. These metals are generally commercially available in the form of spooled tapes, particularly suitable for superconducting tape fabrication, which typically will utilize reel-to-reel tape handling.

The substrate 10 is typically in a tape-like configuration, having a high dimension ratio. As used herein, the term 'dimension ratio' is used to denote the ratio of the length of the substrate or tape to the next longest dimension, the width of the substrate or tape. For example, the width of the tape is generally on the order of about 0.1 to about 10 cm, and the length of the tape is typically at least about 0.1 m, most typically greater than about 5 m. Indeed, superconducting tapes that include substrate 10 may have a length on the order of 100 m or above. Accordingly, the substrate may have a dimension ratio which is fairly high, on the order of not less than 10, not less than about $10^2$, or even not less than about $10^3$. Certain embodiments are longer, having a dimension ratio of $10^4$ and higher.

In one embodiment, the substrate is treated so as to have desirable surface properties for subsequent deposition of the constituent layers of the superconducting tape. For example, the surface may be polished to a desired flatness and surface roughness. Additionally, the substrate may be treated to be biaxially textured as is understood in the art, such as by the known RABiTS (roll assisted biaxially textured substrate) technique, although embodiments herein typically utilize a non-textured, polycrystalline substrate, such as commercially available nickel-based tapes noted above.

Turning to the buffer layer 12, the buffer layer may be a single layer, or more commonly, be made up of several films. Most typically, the buffer layer includes a biaxially textured film, having a crystalline texture that is generally aligned along crystal axes both in-plane and out-of-plane of the film. Such biaxial texturing may be accomplished by IBAD. As is understood in the art, IBAD is acronym that stands for ion beam assisted deposition, a technique that may be advantageously utilized to form a suitably textured buffer layer for subsequent formation of a superconducting layer having desirable crystallographic orientation for superior superconducting properties. Magnesium oxide is a typical material of choice for the IBAD film, and may be on the order of about 1 to about 500 nanometers, such as about 5 to about 50 nanometers. Generally, the IBAD film has a rock-salt like crystal structure, as defined and described in U.S. Pat. No. 6,190,752, incorporated herein by reference.

The buffer layer may include additional films, such as a barrier film provided to directly contact and be placed in between an IBAD film and the substrate. In this regard, the barrier film may advantageously be formed of an oxide, such as yttria, and functions to isolate the substrate from the IBAD film. A barrier film may also be formed of non-oxides such as silicon nitride. Suitable techniques for deposition of a barrier film include chemical vapor deposition and physical vapor deposition including sputtering. Typical thicknesses of the barrier film may be within a range of about 1 to about 200 nanometers. Still further, the buffer layer may also include an epitaxially grown film(s), formed over the IBAD film. In this context, the epitaxially grown film is effective to increase the thickness of the IBAD film, and may desirably be made principally of the same material utilized for the IBAD layer such as MgO or other compatible materials.

In embodiments utilizing an MgO-based IBAD film and/or epitaxial film, a lattice mismatch between the MgO material and the material of the superconducting layer exists. Accordingly, the buffer layer may further include another buffer film, this one in particular implemented to reduce a mismatch in lattice constants between the superconducting layer and the underlying IBAD film and/or epitaxial film. This buffer film may be formed of materials such as YSZ (yttria-stabilized zirconia), magnesia, ceria, gadolinium zirconium oxide, strontium ruthenate, lanthanum manganate, and generally, perovskite-structured ceramic materials. The buffer film may be deposited by various physical vapor deposition techniques.

While the foregoing has principally focused on implementation of a biaxially textured film in the buffer stack (layer) by a texturing process such as IBAD, alternatively, the substrate surface itself may be biaxially textured. In this case, the buffer layer is generally epitaxially grown on the textured substrate so as to preserve biaxial texturing in the buffer layer. One process for forming a biaxially textured substrate is the process known in the art as RABiTS (roll assisted biaxially textured substrates), generally understood in the art.

The superconducting layer 14 is generally in the form of a high-temperature superconductor (HTS) layer. HTS materials are typically chosen from any of the high-temperature superconducting materials that exhibit superconducting properties above the temperature of liquid nitrogen, 77K. Such materials may include, for example, $YBa_2Cu_3O_{7-x}$, $Bi_2Sr_2CaCu_2O_z$, $Bi_2Sr_2Ca_2Cu_3O_{10+y}$, $Tl_2Ba_2Ca_2Cu_3O_{10+y}$, and $HgBa_2Ca_2Cu_3O_{8+y}$. One class of materials includes $REBa_2Cu_3O_{7-x}$, wherein $0 \geq x > 1$ and RE is a rare earth or combination of rare earth elements. Of the foregoing, $YBa_2Cu_3O_{7-x}$, also generally referred to as YBCO, may be advantageously utilized. YBCO may be used with or without the addition of dopants, such as rare earth materials, for example samarium. The superconducting layer 14 may be formed by any one of various techniques, including thick and thin film forming techniques. Preferably, a thin film physical vapor deposition technique such as pulsed laser deposition (PLD) can be used for a high deposition rates, or a chemical vapor deposition technique can be used for lower cost and larger surface area treatment. Typically, the superconducting layer has a thickness on the order of about 0.1 to about 30 microns, most typically about 0.5 to about 20 microns, such as about 1 to about 5 microns, in order to get desirable amperage ratings associated with the superconducting layer 14.

The superconducting article may also include a capping layer 16 and a stabilizer layer 18, which are generally implemented to provide a low resistance interface and for electrical stabilization to aid in prevention of superconductor burnout in practical use. More particularly, layers 16 and 18 aid in continued flow of electrical charges along the superconductor in cases where cooling fails or the critical current density is exceeded, and the superconducting layer moves from the superconducting state and becomes resistive. Typically, a noble metal is utilized for capping layer 16 to prevent unwanted interaction between the stabilizer layer(s) and the superconducting layer 14. Typical noble metals include gold, silver, platinum, and palladium. Silver is typically used due to its cost and general accessibility. The capping layer 16 is typically made to be thick enough to prevent unwanted diffusion of the components used in the application of the stabilizer layer 18 into the superconducting layer 14, but is made to be generally thin for cost reasons (raw material and processing costs). Various techniques may be used for deposition of the capping layer 16, including physical vapor deposition, such as DC magnetron sputtering.

In an embodiment, the capping layer 16 may be formed by electrodeposition of a noble metal. The electrodeposition solution can be a non-reactive solution and may not react with the superconducting layer. Specifically, the electrodeposition solution may preserve the critical current of the superconducting layer, such that the $I_{C(PS)}$ is at least about 95% of the $I_{C(AF)}$.

In an exemplary embodiment, the electrodeposition solution may include a silver salt such as silver nitrate and a sulfur additive such as thiourea in a solution of dimethylsulfoxide (DMSO). The electrodeposition solution may contain silver nitrate in an amount not greater than about 1.0 M, such as between about 0.1 M and about 0.8 M, particularly about 0.62 M. The thiourea may be in an amount between about 10 mM and about 100 mM, such as between about 25 mM and about 75 mM, particularly about 50 mM. The plating current density may be not greater than about 200 mA/cm$^2$, such as between about 1 mA/cm$^2$ to 130 mA/cm$^2$, particularly about 14 mA/cm$^2$.

In an alternative embodiment, the electrodeposition solution may include lithium perchlorate, silver perchlorate, and thiourea in an acetonitrile solution. The lithium perchlorate may be in an amount at least about 0.05 M, but not greater than about 0.5 M, such as between about 0.1 M and about 0.3 M, particularly about 0.2 M. The silver perchlorate may be in an amount at least about 0.05 M, but not greater than about 0.5 M, such as between about 0.1 M and about 0.3 M, particularly about 0.2 M. The total perchlorate concentration may be not greater than about 0.7M, such as not greater than about 0.5M. The thiourea may be in an amount between about 10 mM and about 100 mM, such as between about 25 mM and about 75 mM, particularly 50 mM. The plating current density may be not greater than about 200 mA/cm$^2$, such as between about 1 mA/cm$^2$ to 130 mA/cm$^2$, particularly about 14 mA/cm$^2$.

The stabilizer layer 18 is generally incorporated to overlie the superconducting layer 14, and in particular, overlie and directly contact the capping layer 16 in the particular embodiment shown in FIG. 1. The stabilizer layer 18 functions as a protection/shunt layer to enhance stability against harsh environmental conditions and superconductivity quench. The layer is generally dense and thermally and electrically conductive, and functions to bypass electrical current in case of failure of the superconducting layer or if the critical current of the superconducting layer is exceeded. It may be formed by any one of various thick and thin film forming techniques, such as by laminating a pre-formed copper strip onto the superconducting tape, by using an intermediary bonding material such as a solder. Other techniques have focused on physical vapor deposition, typically evaporation or sputtering, as well as wet chemical processing such as electro-less plating, and electroplating. In this regard, the capping layer 16 may function as a seed layer for deposition of copper thereon. Notably, the capping layer 16 and the stabilizer layer 18 may be altered or not used, as described below in accordance with various embodiments.

The stabilizer layer 18 may be formed by electrodeposition of a non-noble metal, such as copper or aluminum. The stabilizer layer 18 may be formed to a thickness of at least about 20 microns. Additionally, the stabilizer layer 18 may extend around the periphery of the superconducting article, thereby encasing it. The electrodeposition solution may be non-reactive solution with the superconducting layer. Specifically, the critical current of the superconducting layer may not be effected by the electrodeposition solution, such that the $I_{C(PS)}$ is at least about 95% of the $I_{C(AF)}$, such as at least about 97% of the $I_{C(AF)}$, particularly at least about 99% of the $I_{C(AF)}$.

In an exemplary embodiment, the stabilizer layer 18 may be deposited atop a capping layer 16 having a thickness not greater than about 1.0 micron, such as not greater than about 0.5 microns, particularly not greater than about 0.3 microns. The capping layer 16 may be formed by various methods including sputtering and electrodeposition. In an alternate embodiment, the stabilizer layer 18 may be deposited directly atop the superconducting layer.

In an exemplary embodiment, the electrodeposition solution may include a copper salt such as copper nitrate and a sulfur additive such as thiourea in a solution of dimethylsulfoxide (DMSO). The electrodeposition solution may contain copper nitrate in an amount at least about 0.1 M, but not greater than about 3.0 M, such as between about 1.0 M and about 2.0 M, particularly about 1.4 M. The thiourea may be in an amount not greater than about 100 mM, such as between about 10 mM and about 75 mM, particularly about 26 mM. The plating current density may be not greater than about 200 mA/cm$^2$, such as between about 1 mA/cm$^2$ to 150 mA/cm$^2$, particularly about 50 mA/cm$^2$.

According to prior art approaches, a sufficiently thick capping layer is needed to prevent reaction of the components used in the application of the stabilizer layer with the superconductor layer. In particular, conventional solutions used in electroplating a stabilizer layer such as copper are very reactive with the superconductor layer and thus destroy the critical current capability of the superconductor layer. It has been found that a capping layer at least 1 micron in thickness is needed between the superconductor layer and the stabilizer layer in order to avoid such a reaction and reduction in the critical current capability of the superconductor layer. Also, solders used in bonding a strip of the stabilizer layer to the superconductor layer have also been found to deteriorate the quality of the superconductor if a sufficiently thick capping layer is not used. In contrast, according to embodiments herein, solutions used in electroplating the stabilizer layer are non-reactive to the HTS layer allowing the capping layer to be reduced in thickness or eliminated.

While the invention has been illustrated and described in the context of specific embodiments, it is not intended to be limited to the details shown, since various modifications and substitutions can be made without departing in any way from the scope of the present invention. For example, additional or equivalent substitutes can be provided and additional or equivalent production steps can be employed. As such, further modifications and equivalents of the invention herein disclosed may occur to persons skilled in the art using no more than routine experimentation, and all such modifications and equivalents are believed to be within the scope of the invention as defined by the following claims.

What is claimed is:

1. A method of forming a superconducting article comprising:

providing a substrate tape;

forming a superconducting layer overlying the substrate tape, the superconducting layer having an as-formed critical current $I_{C(AF)}$;

electrodepositing a capping layer having a thickness not greater than about 0.5 micron overlying the superconducting layer, the capping layer comprises silver wherein depositing the capping layer includes contacting the substrate tape including the superconducting layer with a silver electrodeposition solution, wherein the silver electrodeposition solution is non-reactive to the superconducting layer and consists essentially of silver nitrate, thiourea, and dimethylsulfoxide; and electrodepositing a stabilizer layer overlying the capping layer using a solution that is non-reactive to the superconducting layer, the superconducting layer having a post-stabilized critical current $I_{C(PS)}$, which is at least 95% of the $I_{C(AF)}$, wherein the superconducting article has a length of greater than 5 m and a dimension ratio of not less than $10^2$.

2. The method of claim 1 wherein the $I_{C(PS)}$ is at least 97% of the $I_{C(AF)}$.

3. The method of claim 1 wherein the $I_{C(PS)}$ is at least 99% of the $I_{C(AF)}$.

4. The method of claim 1 wherein the superconducting layer includes a rare-earth oxide having a general formula $REBa_2Cu_3O_{7-x}$, where $0 \geq x > 1$.

5. The method according to claim 1, wherein the thiourea is present in the electrodeposition solution at a concentration between 10 mM and 75 mM.

* * * * *